(12) United States Patent
Tsai et al.

(10) Patent No.: US 9,041,142 B2
(45) Date of Patent: May 26, 2015

(54) SEMICONDUCTOR DEVICE AND OPERATING METHOD FOR THE SAME

(71) Applicant: Macronix International Co., Ltd., Hsinchu (TW)

(72) Inventors: Ying-Chieh Tsai, Chiayi (TW); Wing-Chor Chan, Hsinchu (TW); Jeng Gong, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 31 days.

(21) Appl. No.: 13/710,505

(22) Filed: Dec. 11, 2012

(65) Prior Publication Data

US 2014/0159110 A1    Jun. 12, 2014

(51) Int. Cl.
*H01L 29/739*    (2006.01)

(52) U.S. Cl.
CPC .................................. *H01L 29/7393* (2013.01)

(58) Field of Classification Search
CPC ............ H01L 29/7393; H01L 29/7835; H01L 29/7801
USPC ................. 257/476, 477, 478, 479, 484, 355, 257/E27.015, 480, 486
See application file for complete search history.

(56) References Cited

U.S. PATENT DOCUMENTS

| 2002/0066906 A1* | 6/2002 | Werner ........................ 257/124 |
| 2005/0110097 A1* | 5/2005 | Chen ............................. 257/369 |

* cited by examiner

*Primary Examiner* — Kyoung Lee
*Assistant Examiner* — Ratisha Mehta
(74) *Attorney, Agent, or Firm* — McClure, Qualey & Rodack, LLP (57) ABSTRACT

A semiconductor device and an operating method for the same are provided. The semiconductor structure comprises a first doped region, a second doped region, a third doped region, a fourth doped region and a first gate structure. The first doped region has a first type conductivity. The second doped region has a second type conductivity opposite to the first type conductivity. The first doped region is surrounded by the second doped region. The third doped region has the first type conductivity. The fourth doped region has the second type conductivity. The first gate structure is on the second doped region. The third doped region and the fourth doped region are in the second doped region and the first doped region on opposing sides of the first gate structure respectively.

14 Claims, 10 Drawing Sheets

SEMICONDUCTOR DEVICE AND OPERATING METHOD FOR THE SAME

BACKGROUND

1. Technical Field

The disclosure relates in general to a semiconductor device and an operating method for the same and more particularly to an IGBT and an operating method for the same.

2. Description of the Related Art

In the semiconductor technology, the feature size of the semiconductor structure has been reduced. In the meantime, the rate, the efficiency, the density and the cost per integrated circuit unit have been improved.

Shrinking the device area would drop the electrical efficiency of the semiconductor structure dramatically. For maintain the electrical efficiency of the semiconductor structure, during operating the device, it is desired that the high operating voltage and leakage of the HV device would not affect the LV device to reduce the operating efficiency of the semiconductor device.

SUMMARY

A semiconductor structure is provided. The semiconductor structure comprises a first doped region, a second doped region, a third doped region, a fourth doped region and a first gate structure. The first doped region has a first type conductivity. The second doped region has a second type conductivity opposite to the first type conductivity. The first doped region is surrounded by the second doped region. The third doped region has the first type conductivity. The fourth doped region has the second type conductivity. The first gate structure is on the second doped region. The third doped region and the fourth doped region are in the second doped region and the first doped region on opposing sides of the first gate structure respectively.

An operating method for a semiconductor structure is provided. The semiconductor structure comprises a first doped region, a second doped region, a third doped region, a fourth doped region and a first gate structure. The first doped region has a first type conductivity. The second doped region has a second type conductivity opposite to the first type conductivity. The first doped region is surrounded by the second doped region. The third doped region has the first type conductivity. The fourth doped region has the second type conductivity. The first gate structure is on the second doped region. The third doped region and the fourth doped region are in the second doped region and the first doped region on opposing sides of the first gate structure respectively. The operating method for the semiconductor structure comprises following steps. A first voltage is applied to the first gate structure. The fourth doped region is coupled to a first electrode. The first electrode is one of an anode and a cathode. The second doped region and the third doped region is coupled to a second electrode. The second electrode is another of the anode and the cathode.

The above and other aspects of the disclosure will become better understood with regard to the following detailed description of the non-limiting embodiment(s). The following description is made with reference to the accompanying drawings.

DETAILED DESCRIPTION

Figure 1:
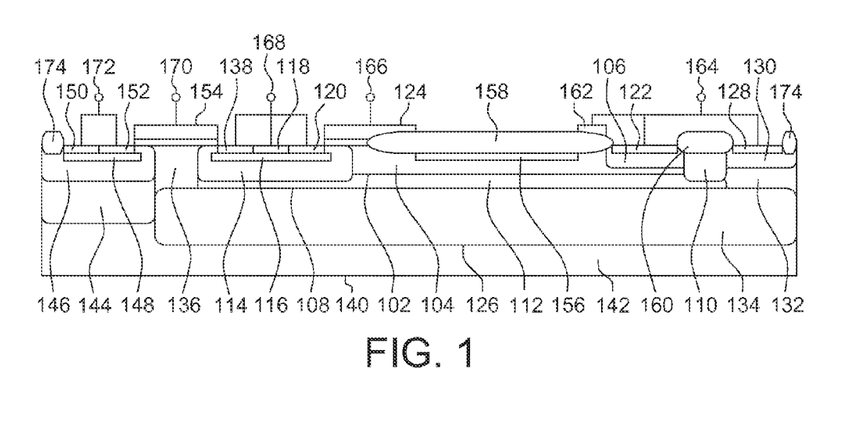
FIG. 1 illustrates a cross-section view of a semiconductor structure according to one embodiment.

FIG. 1 illustrates a cross-section view of a semiconductor structure according to one embodiment. A first doped region 102 may comprise a doped well 104 and a doped well 106 adjoined to each other. In one embodiment, the doped well 104 and the doped well 106 has a first type conductivity such as N type conductivity. For example, the doped well 104 is a HVNW.

A second doped region 108 may comprise a doped well 110, a buried doped layer 112, a doped well 114, a first doped layer 116 and a doped contact region 118 adjoined together. In one embodiment, the doped well 110, the buried doped layer 112, the doped well 114, the first doped layer 116 and the doped contact region 118 has a second type conductivity such as P type conductivity, opposite to the first type conductivity. For example, the doped well 110 and the doped well 114 are HVPD. The doped contact region 118 may be heavily doped (P+).

In embodiments, the doped well 104 and the doped well 106 of the first doped region 102 is surrounded by the doped well 110, the buried doped layer 112, the doped well 114, the first doped layer 116 and the doped contact region 118 of the second doped region 108.

The third doped region 120 is among the doped well 114, the first doped layer 116 and the doped contact region 118 of the second doped region 108. In one embodiment, the third doped region 120 has the first type conductivity such as N type conductivity. For example, the third doped region 120 is a heavily doped (N+) contact region.

A fourth doped region 122 is disposed in the doped well 106 of the first doped region 102. In one embodiment, the fourth doped region 122 has the second type conductivity such as P type conductivity. For example, the fourth doped region 122 is a heavily doped (P+) contact region.

A first gate structure 124 is on the doped well 114 between the doped well 104 and the third doped region 120.

A fifth doped region 126 may comprise a doped contact region 128, a doped well 130, a doped well 132, a buried doped layer 134 and a doped well 136 adjoined together. In one embodiment, the doped contact region 128, the doped well 130, the doped well 132, the buried doped layer 134 and the doped well 136 have the first type conductivity such as N type conductivity. For example, the doped contact region 128 is heavily doped (N+). The doped well 136 is a HVNW. In one embodiment, the second doped region 108 is surrounded by the doped contact region 128, the doped well 130, the doped well 132, the buried doped layer 134 and the doped well 136 of the fifth doped region 126, as shown in FIG. 1.

A sixth doped region 140 may comprise a substrate 142, a buried doped region 144, a doped well 146, a second doped layer 148 and a doped contact region 150 adjoined together. In one embodiment, the substrate 142, the buried doped region 144, the doped well 146, the second doped layer 148 and the doped contact region 150 have the second type conductivity such as P type conductivity. For example, the doped well 146 is a HVPD. The doped contact region 150 is heavily doped (P+).

A doped contact region 138 is disposed among the doped well 114, the first doped layer 116 and the doped contact region 118 of the second doped region 108. In one embodiment, the doped contact region 138 has the first type conductivity such as N type conductivity. For example, the doped contact region 138 is heavily doped (N+).

A doped contact region 152 is disposed among the doped well 146, the second doped layer 148 of the sixth doped region 140 and the doped contact region 150. In one embodiment, the doped contact region 152 has the first type conductivity such as N type conductivity. For example, the doped contact region 152 is heavily doped (N+).

A second gate structure 154 is disposed on the doped well 114, the doped well 136 and the doped well 146 between the doped contact region 138 and the doped contact region 152.

A top doped layer 156 may be disposed between an isolation layer 158 and the doped well 104 of the first doped region 102. In one embodiment, the top doped layer 156 has the second type conductivity such as P type conductivity. A conductive layer 162 may be disposed on the isolation layer 158. The conductive layer 162 may comprise polysilicon. An isolation layer 160 may be disposed on the doped well 110 of the second doped region 108. The isolation layer 158 and the isolation layer 160 are not limited to FOX as shown in FIG. 1, and may use other suitable insulating structure such as STI.

In embodiments, the third doped region 120, the doped contact region 138 and the doped contact region 118 of the second doped region 108 may be electrically connected to an electrode 168 such as a cathode. A voltage of the electrode 168 may be 0V, or the electrode 168 may be grounded. The fourth doped region 122, the conductive layer 162 and the doped contact region 128 of the fifth doped region 126 may be electrically connected to an electrode 164 such as anode. A voltage of the electrode 164 may be 0V~700V. The first gate structure 124 may be electrically connected to an electrode 166 that may apply 0V~15V to the first gate structure 124. The second gate structure 154 may be electrically connected to an electrode 170 that may apply 0V~15V to the second gate structure 154. The doped contact region 152 and the doped contact region 150 of the sixth doped region 140 may be electrically connected to an electrode 172 such as a cathode. A voltage of the electrode 172 may be 0V, or the electrode 172 may be grounded.

In embodiments, the semiconductor structure is functioned as an IGBT device. For example, the first gate structure 124 is functioned as an IGBT gate. The fourth doped region 122 is electrically connected to the anode such as the electrode 164 of the IGBT. The third doped region 120 is electrically connected to the cathode such as the electrode 168 of the IGBT. The doped well 114 is electrically connected to the buried doped layer 112 under the doped well 104 and the doped well 110 between the doped well 130 and the doped well 106. Therefore, during operating the IGBT by high voltage, an inversion layer is generated by lifting voltage from the electrode 164. Hole current induced from inversion layer would be restrict to flow in the buried doped layer 112 and the doped well 110 having the second type conductivity such as P type conductivity. Therefore, the hole current can be prevented from going into the substrate 142 and affecting other devices such as LV devices.

The second gate structure 154 may be functioned as a DMOS gate for controlling forming channels in doped well 146 adjacent to the doped contact region 152 and in the doped well 114 adjacent to the doped contact region 138. In embodiments, the IGBT may provide an addition current path by the second gate structure 154 for forming the channel connected to the doped contact region 152, the doped contact region 138, the doped well 136, the buried doped layer 134, the doped well 132, the doped well 130, and the doped contact region 128. In other words, the IGBT can have multi channels. Therefore, the anode (electrode 164) current of the IGBT device can be increased. In addition, PN junction between the doped well 136, the buried doped layer 134, the doped well 132, the doped well 130, the doped contact region 128 having the first type conductivity such as N type conductivity and the doped well 114, the buried doped layer 112, the doped well 110 having the second type conductivity such as P type conductivity can restrict the hole current induced from the inversion layer during operating the IGBT device by high voltage in the buried doped layer 112 and the doped well 110. Therefore, the hole current can be prevented from going into the substrate 142 and affecting other devices such as LV devices. In embodiments, the IGBT device has low turn on voltage and low turn on resistance (Rdson-sp).

The first doped layer 116 among the doped contact region 118, the third doped region 120, the doped contact region 138 and the doped well 114, and the second doped layer 148 among the doped contact region 150, the doped contact region 152 and the doped well 146 can prevent the device from punch through effect during operation.

Figure 2:
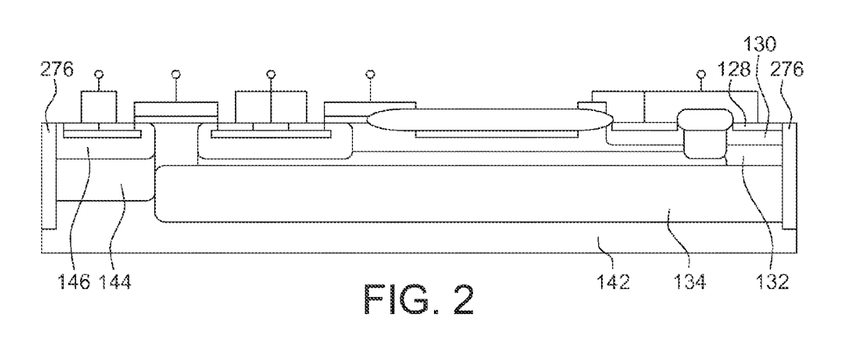
FIG. 2 illustrates a cross-section view of a semiconductor structure according to one embodiment.

The semiconductor structure in FIG. 2 is different from the semiconductor structure in FIG. 1 in that an isolation layer 174 in FIG. 1 is replaced by a deep trench isolation 276 that surrounds the active region. For example, the deep trench isolation 276 may be on sides of the doped contact region 128, the doped well 130, the doped well 132 and the buried doped layer 134 and may be extended in the substrate 142 under the buried doped layer 134. In addition, the deep trench isolation 276 may be on sides of the doped well 146 and the buried doped region 144 and may be extended in the substrate 142 under the buried doped region 144. The deep trench isolation 276 could suppress the substrate current between the HVIGBT device and other devices such as CMOS. The deep trench isolation 276 may be formed by a dielectric material.

Figure 3:
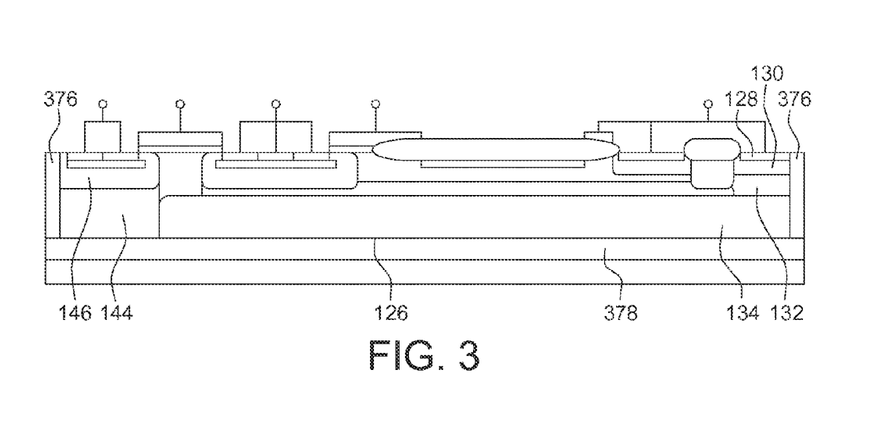
FIG. 3 illustrates a cross-section view of a semiconductor structure according to one embodiment.

The semiconductor structure in FIG. 3 is different from the semiconductor structure in FIG. 2 in that, a buried insulating layer 378 is disposed under the buried doped layer 134 of the fifth doped region 126. The deep trench isolation 376 on the sides of the doped contact region 128, the doped well 130, the doped well 132 and the buried doped layer 134, and the deep trench isolation 376 on the sides of the buried doped region 144 and the doped well 146 are adjoined on the buried insulating layer 378. In some embodiments, the deep trench isolation 376 may be extended into the buried insulating layer 378. The deep trench isolation 376 and the buried insulating layer 378 may be formed by a dielectric material. The deep trench isolation 376 and the buried insulating layer 378 could suppress the substrate current between the HVIGBT device and other devices such as CMOS.

Figure 4:
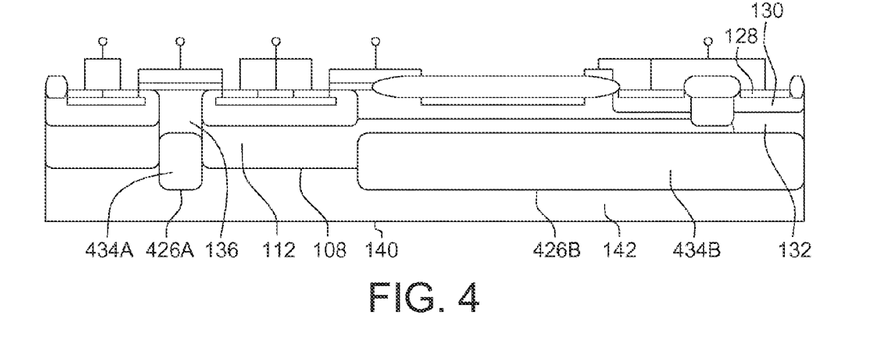
FIG. 4 illustrates a cross-section view of a semiconductor structure according to one embodiment.

The semiconductor structure in FIG. 4 is different from the semiconductor structure in FIG. 1 in that the fifth doped region 426A comprises the doped well 136 and the buried doped layer 434A adjoined together. The fifth doped region 426B comprises the doped contact region 128, the doped well 130, the doped well 132, and the buried doped layer 434B adjoined together. The doped well 136, the buried doped layer 434A, the doped contact region 128, the doped well 130, the doped well 132, the buried doped layer 434B have the first type conductivity such as N type conductivity. The buried doped layer 434A and the buried doped layer 434B are separated from each other by the buried doped layer 112 of the second doped region 108 and the substrate 142 of sixth doped region 140 adjoined together. In one embodiment, the substrate 142 may be grounded, Therefore, the hole current induced from the inversion layer during operating the IGBT device could flow into the buried doped layer 112 between the buried doped layer 434A and the buried doped layer 434B, and collected to the substrate 142.

Figure 5:
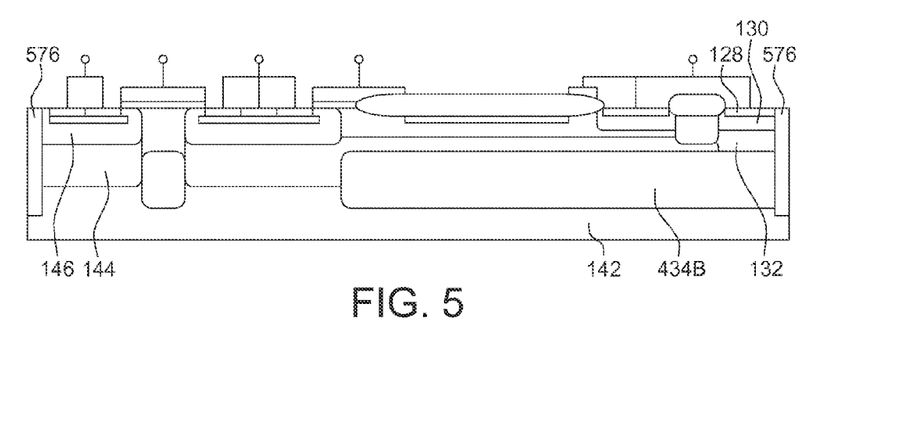
FIG. 5 illustrates a cross-section view of a semiconductor structure according to one embodiment.

The semiconductor structure in FIG. 5 is different from the semiconductor structure in FIG. 4 in that the isolation layer 174 in FIG. 4 is replaced by a deep trench isolation 576 that surrounds the active region. For example, the deep trench isolation 576 may be on the sides of the doped contact region 128, the doped well 130, the doped well 132 and the buried doped layer 434B and may be extended in the substrate 142 under the buried doped layer 434B. In addition, the deep trench isolation 576 may be on the sides of the doped well 146 and the buried doped region 144 and may be extended in the substrate 142 under the buried doped region 144. The deep trench isolation 576 could suppress the substrate current between the HVIGBT device and other devices such as CMOS.

Figure 6:
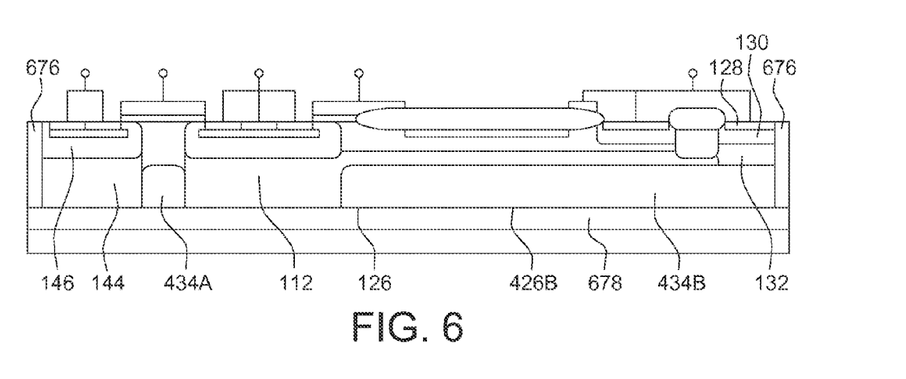
FIG. 6 illustrates a cross-section view of a semiconductor structure according to one embodiment.

The semiconductor structure in FIG. 6 is different from the semiconductor structure in FIG. 5 in that the buried insulating layer 678 is disposed under the buried doped layer 434B of the fifth doped region 426B. The deep trench isolation 676 on the sides of the doped contact region 128, the doped well 130, the doped well 132 and the buried doped layer 434B, and the deep trench isolation 676 on the sides of the buried doped region 144 and the doped well 146 are adjoined on the buried insulating layer 678. In some embodiments, the deep trench isolation 676 may be extended into the buried insulating layer 678. The deep trench isolation 676 and the buried insulating layer 678 may be formed by a dielectric material.

Figure 7:
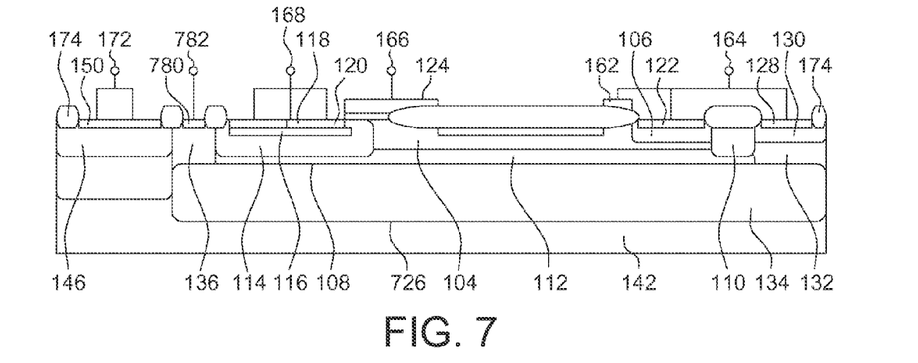
FIG. 7 illustrates a cross-section view of a semiconductor structure according to one embodiment.

The semiconductor structure in FIG. 7 is different from the semiconductor structure in FIG. 1 in that the second gate structure 154, the doped contact region 138, the doped contact region 152 and the second doped layer 148 in FIG. 1 are omitted. The fifth doped region 726 may comprise the doped contact region 128, the doped well 130, the doped well 132, the buried doped layer 134, the doped well 136 and the doped contact region 780 adjoined together. In one embodiment, the doped contact region 128, the doped well 130, the doped well 132, the buried doped layer 134, the doped well 136 and the doped contact region 780 have the first type conductivity such as N type conductivity. For example, the doped contact region 780 is heavily doped (N+). In one embodiment, the second doped region 108 is surrounded by the doped contact region 128, the doped well 130, the doped well 132, the buried doped layer 134, the doped well 136 and the doped contact region 780 of the fifth doped region 726, as shown in FIG. 7.

Referring to FIG. 7, in embodiments, the doped contact region 150 on the doped well 146 is electrically connected to the electrode 172 such as the cathode. A voltage of the electrode 172 may be 0V, or the electrode 168 may be grounded. The doped contact region 780 is electrically connected to the electrode 782 such as the cathode. A voltage of the electrode 782 may be 0V~15V. The doped contact region 118 and the third doped region 120 on the first doped layer 116 are electrically connected to the electrode 168 such as the cathode. A voltage of the electrode 168 may be 0V, or the electrode 168 may be grounded. The first gate structure 124 may be electrically connected to an electrode 166 that may apply 0V~15V to the first gate structure 124. The fourth doped region 122, the conductive layer 162 and the doped contact region 128 of the fifth doped region 726 may be electrically connected to the electrode 164. A voltage of the electrode 168 may be 0V In embodiments, the semiconductor structure is functioned as an IGBT device. For example, the first gate structure 124 is functioned as an IGBT gate. The fourth doped region 122 is electrically connected to the anode such as the electrode 164 of the IGBT. The third doped region 120 is electrically connected to the cathode such as the electrode 168 of the IGBT. The doped well 114 is electrically connected to the buried doped layer 112 under the doped well 104 and the doped well 110 between the doped well 130 and the doped well 106. Therefore, during operating the IGBT by high voltage, an inversion layer is generated by lifting voltage from the electrode 164. Hole current induced from inversion layer would be restrict to flow in the buried doped layer 112 and the doped well 110 having the second type conductivity such as P type conductivity. Therefore, the hole current can be prevented from going into the substrate 142 and affecting other devices such as LV devices.

In embodiments, the IGBT may provide an addition current path formed by fifth doped region 726 electrically connected to the anode such as the electrode 164 and the cathode such as the electrode 782. In other words, the IGBT can have multi channels. Therefore, the anode (electrode 164) current of the IGBT device can be increased. In addition, PN junction between the fifth doped region 726 having the first type conductivity such as N type conductivity and the second doped region 108 having the second type conductivity such as P type conductivity can restrict the hole current induced from the inversion layer during operating the IGBT device by high voltage in the buried doped layer 112 and the doped well 110. Therefore, the hole current can be prevented from going into the substrate 142 and affecting other devices such as LV devices. In embodiments, the IGBT device has low turn on voltage and low turn on resistance (Rdson-sp).

Figure 8:
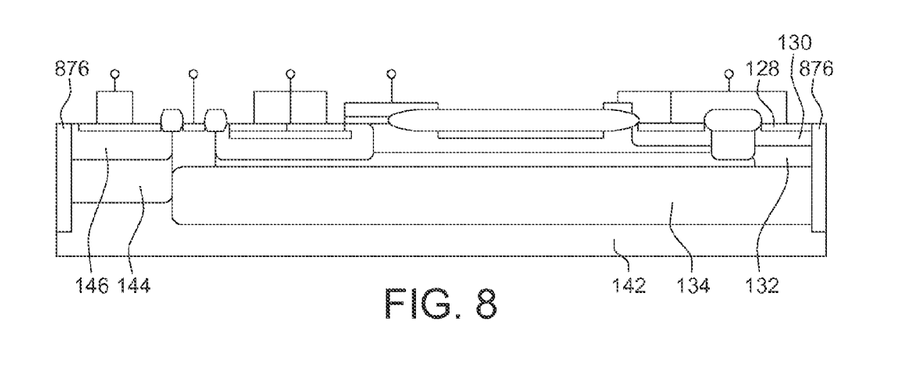
FIG. 8 illustrates a cross-section view of a semiconductor structure according to one embodiment.

The semiconductor structure in FIG. 8 is different from the semiconductor structure in FIG. 7 in that the isolation layer 174 in FIG. 7 is replaced by the deep trench isolation 876 that surrounds the active region. For example, the deep trench isolation 876 may be on the sides of the doped contact region 128, the doped well 130, the doped well 132 and the buried doped layer 134 and may be extended in the substrate 142 under the buried doped layer 134. In addition, the deep trench isolation 876 may be on the sides of the doped well 146 and the buried doped region 144 and may be extended in the substrate 142 under the buried doped region 144. The deep trench isolation 876 could suppress the substrate current between the HVIGBT device and other devices such as CMOS.

Figure 9:
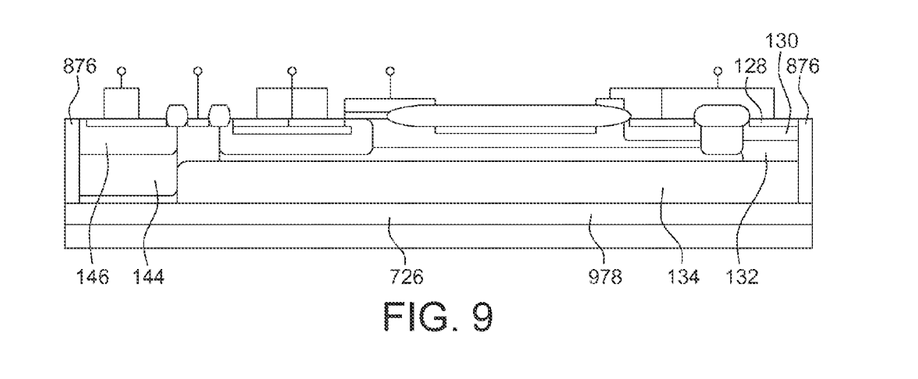
FIG. 9 illustrates a cross-section view of a semiconductor structure according to one embodiment.

The semiconductor structure in FIG. 9 is different from the semiconductor structure in FIG. 8 in that the buried insulating layer 978 is disposed under the buried doped layer 134 of the fifth doped region 726. The deep trench isolation 876 on the sides of the doped contact region 128, the doped well 130, the doped well 132 and the buried doped layer 134, and the deep trench isolation 876 on the sides of the buried doped region 144 and the doped well 146 are adjoined on the buried insulating layer 978. In some embodiments, the deep trench isolation 876 may be extended into the buried insulating layer 978. The deep trench isolation 876 and the buried insulating layer 978 could suppress the substrate current between the HVIGBT device and other devices such as CMOS.

Figure 10:
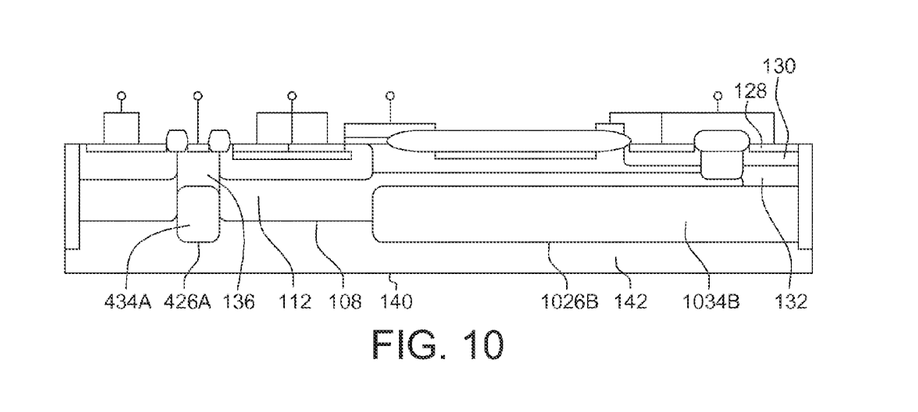
FIG. 10 illustrates a cross-section view of a semiconductor structure according to one embodiment.

The semiconductor structure in FIG. 10 is different from the semiconductor structure in FIG. 8 in that the fifth doped region 1026A comprises the doped well 136 and the buried doped layer 1034A adjoined together. The fifth doped region 1026B comprises the doped contact region 128, the doped well 130, the doped well 132, and the buried doped layer 1034B adjoined together. The doped well 136, the buried doped layer 1034A, the doped contact region 128, the doped well 130, the doped well 132, the buried doped layer 1034B have the first type conductivity such as N type conductivity. The buried doped layer 1034A and the buried doped layer 1034B are separated from each other by the buried doped layer 112 of the second doped region 108 and the substrate 142 of sixth doped region 140 adjoined together. In one embodiment, the substrate 142 may be grounded, Therefore, the hole current induced from the inversion layer during operating the IGBT device could flow into the buried doped layer 112 between the buried doped layer 1034A and the buried doped layer 1034B, and collected to the substrate 142.

Figure 11:
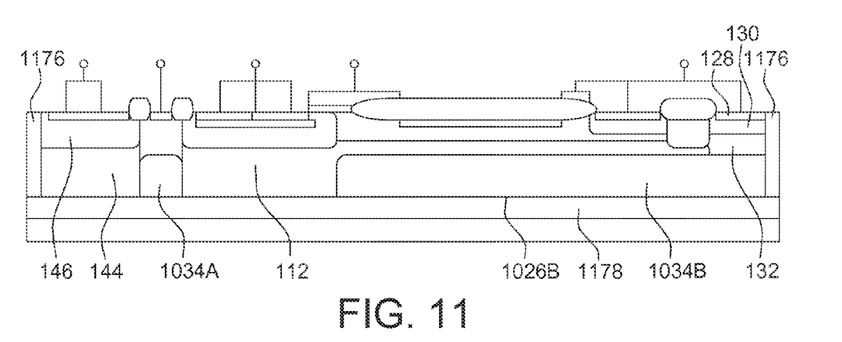
FIG. 11 illustrates a cross-section view of a semiconductor structure according to one embodiment.

The semiconductor structure in FIG. 11 is different from the semiconductor structure in FIG. 10 in that the buried insulating layer 1178 is disposed under the buried doped layer 1034B of the fifth doped region 1026B. The deep trench isolation 1176 on the sides of the doped contact region 128, the doped well 130, the doped well 132 and the buried doped layer 1034B, and the deep trench isolation 1176 on the sides of the buried doped region 144 and the doped well 146 are adjoined on the buried insulating layer 1178. In some embodiments, the deep trench isolation 1176 may be extended into the buried insulating layer 1178. The deep trench isolation 1176 and the buried insulating layer 1178 could suppress the substrate current between the HVIGBT device and other devices such as CMOS.

Figure 12:
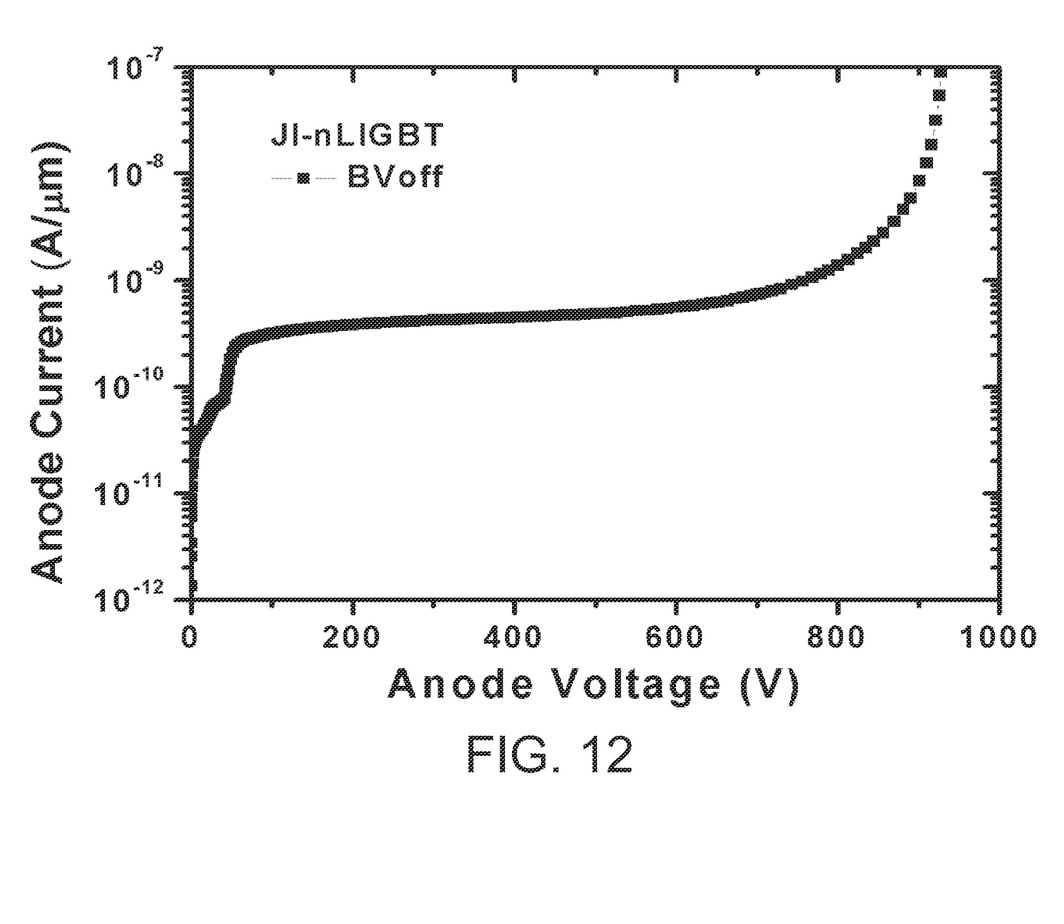
FIG. 12 illustrates a cross-section view of a semiconductor structure according to one embodiment.
Figure 13:
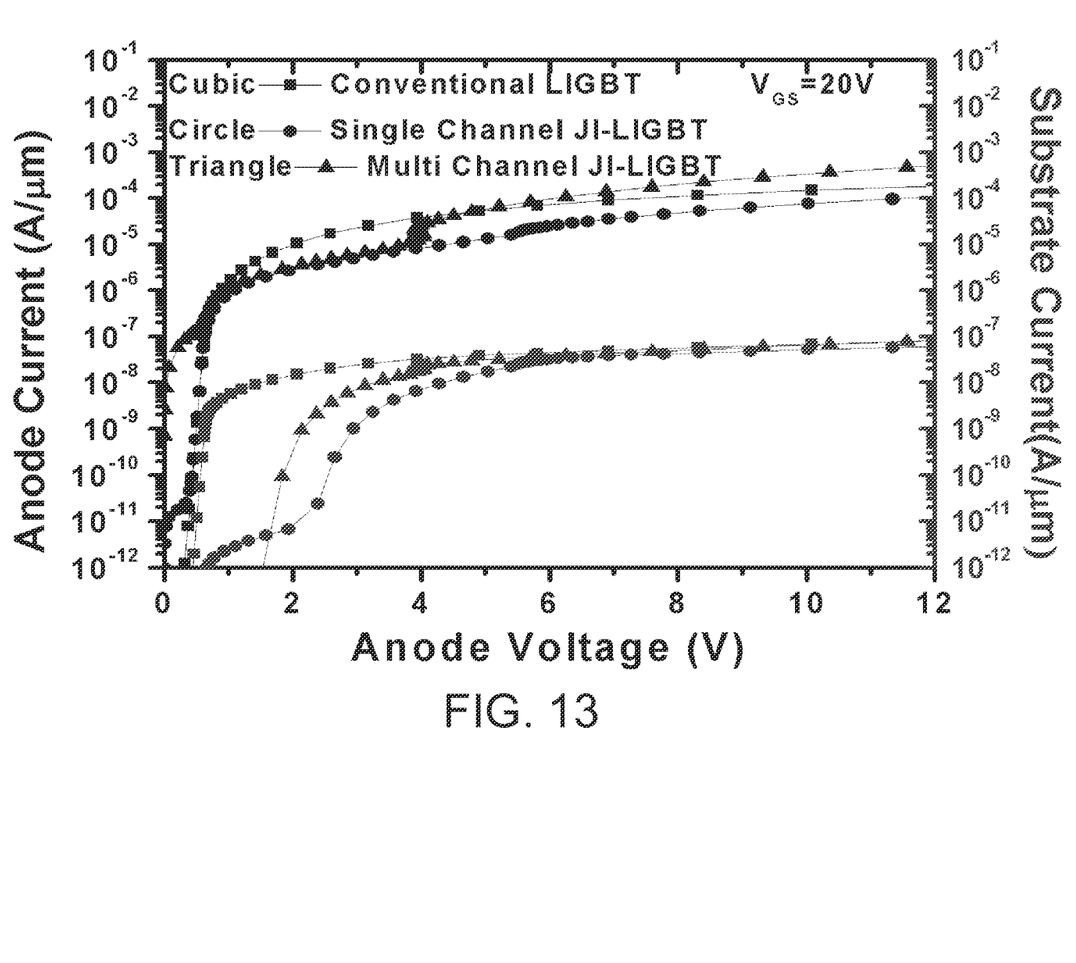
FIG. 13 shows electric characteristics of semiconductor structures.
Figure 14:
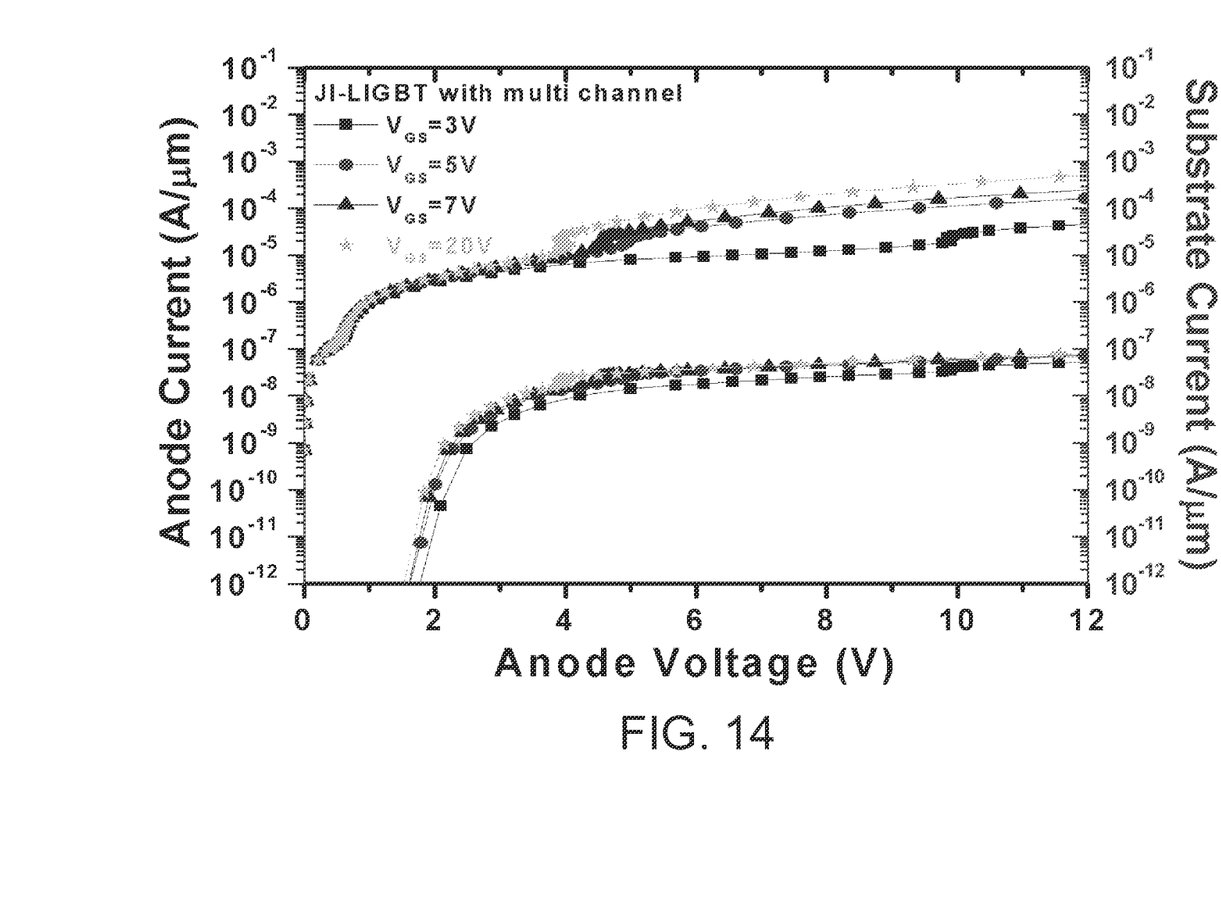
FIG. 14 shows electric characteristics of semiconductor structures in embodiments.
Figure 15:
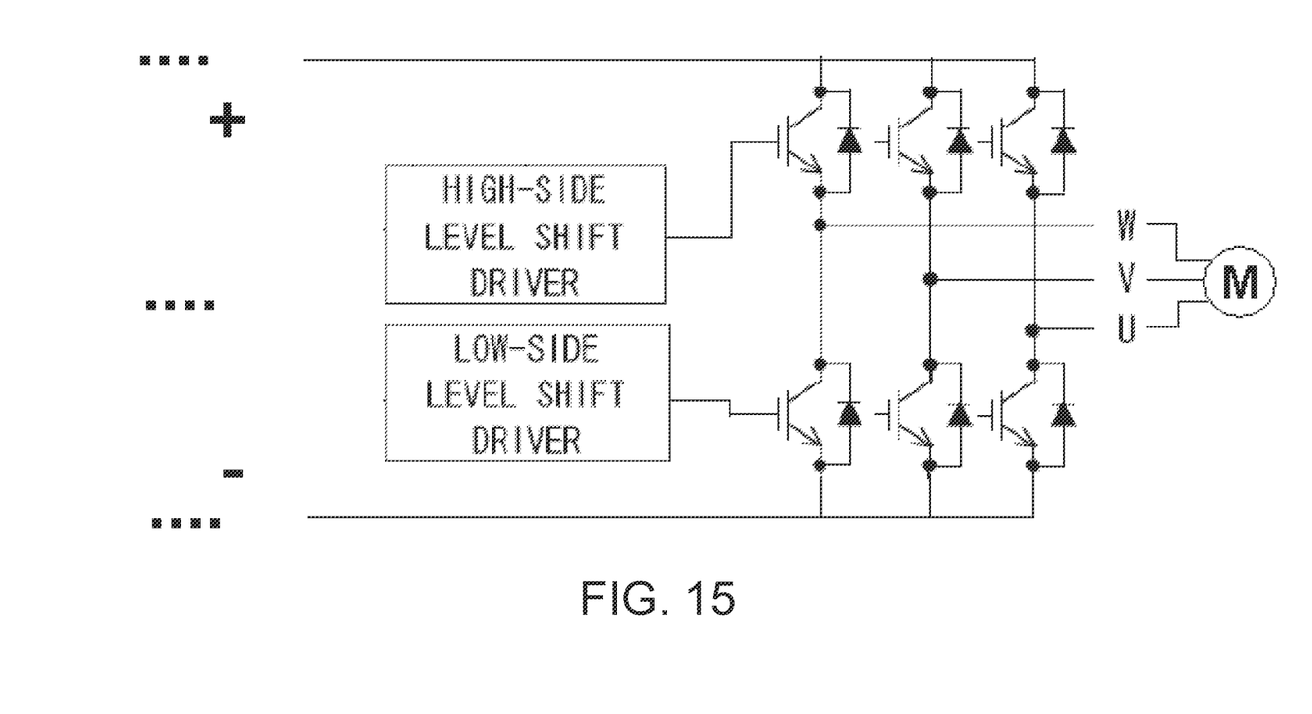
FIG. 15 is an electric circuit uses a semiconductor structures in one embodiment.

In embodiment, the semiconductor structure may be functioned as an IBGT, having electric characteristic as shown in FIG. 12, a breakdown voltage (Vb) is about 900. The results in FIG. 13 show that the substrate current leakage of the conventional IGBT (comparative example) is high as the device is operated by a low voltage. The high current leakage would affect adjacent devices such as LV devices. In embodiments, the substrate current leakage of the semiconductor structure with the single channel (i.e. without the second gate structure functioned as DMOS gate) is low while the device has a low anode current. In embodiments, the substrate current leakage of the semiconductor structure with the multi channels (i.e. with the second gate structure functioned as DMOS gate) can have a high anode current while the substrate current leakage is not increased. The results in FIG. 14 show that the semiconductor structure with the multi channels (i.e. with the second gate structure functioned as DMOS gate) can have high anode current while the substrate current leakage is not increased. The IGBT semiconductor structure in embodiments can used for providing high output current, and can be applied for motor drivers, as shown in FIG. 15.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first doped region having a first type conductivity;
   a second doped region having a second type conductivity opposite to the first type conductivity, wherein the first doped region is surrounded by the second doped region;
   a third doped region having the first type conductivity;
   a fourth doped region having the second type conductivity;
   a first gate structure on the second doped region, wherein the third doped region and the fourth doped region are in the second doped region and the first doped region on opposing sides of the first gate structure respectively;
   a fifth doped region comprising a doped well, wherein the fifth doped region and the doped well have the first type conductivity, the second doped region is surrounded by the fifth doped region;
   a sixth doped region having the second type conductivity; and
   a doped contact region having the first type conductivity and in the sixth doped region; and
   a second gate structure on the doped well of the fifth doped region and on the sixth doped region.

2. The semiconductor structure according to claim 1, wherein the fourth doped region is electrically connected to one of an anode and a cathode, the second doped region and the third doped region are electrically connected to another of the anode and the cathode.

3. The semiconductor structure according to claim 1, wherein portions of the fifth doped region respectively on opposing sides of the second doped region are electrically connected to an anode and a cathode.

4. The semiconductor structure according to claim 1, further comprising:
   another doped contact region having the first type conductivity, wherein the second doped region is between the fifth doped region and the another doped contact region; wherein the second gate structure is on a portion of the fifth doped region adjacent to the another doped contact region.

5. The semiconductor structure according to claim 4, wherein the fifth doped region is electrically connected to one of an anode and a cathode, the another doped contact region is electrically connected to another of the anode and the cathode.

6. The semiconductor structure according to claim 1, wherein the fifth doped region is electrically connected to one of an anode and a cathode, the doped contact region and the sixth doped region are electrically connected to another of the anode and the cathode.

7. The semiconductor structure according to claim 1, further comprising a deep trench isolation outside of the second doped region.

8. The semiconductor structure according to claim 1, further comprising a buried insulating layer under the second doped region.

9. An operating method for a semiconductor structure, wherein the semiconductor structure comprises:
   a first doped region having a first type conductivity;
   a second doped region having a second type conductivity opposite to the first type conductivity, wherein the first doped region is surrounded by the second doped region;

a third doped region having the first type conductivity;
a fourth doped region having the second type conductivity;
a first gate structure on the second doped region, wherein the third doped region and the fourth doped region are in the second doped region and the first doped region on opposing sides of the first gate structure respectively;
a fifth doped region comprising a doped well, wherein the fifth doped region and the doped well have the first type conductivity, the second doped region is surrounded by the fifth doped region;
a sixth doped region having the second type conductivity; and
a doped contact region having the first type conductivity and in the sixth doped region; and
a second gate structure on the doped well of the fifth doped region and on the sixth doped region, the operating method for the semiconductor structure comprises:
applying a first voltage to the first gate structure;
coupling the fourth doped region to a first electrode, wherein the first electrode is one of an anode and a cathode; and
coupling the second doped region and the third doped region to a second electrode, wherein the second electrode is another of the anode and the cathode.

10. The operating method for the semiconductor structure according to claim 9, further comprising coupling portions of the fifth doped region respectively on opposing sides of the second doped region to the first electrode and the second electrode.

11. The operating method for the semiconductor structure according to claim 9, wherein the semiconductor structure further comprises:
another doped contact region having the first type conductivity, wherein the second doped region is between the fifth doped region and the another doped contact region;
wherein the second gate structure is on a portion of the fifth doped region adjacent to the another doped contact region.

12. The operating method for the semiconductor structure according to claim 11, further comprising:
applying a second voltage to the second gate structure;
coupling the fifth doped region to the first electrode; and
coupling the another doped contact region to the second electrode.

13. The operating method for the semiconductor structure according to claim 9, further comprising:
applying a second voltage to the second gate structure;
coupling the fifth doped region to the first electrode; and
coupling the doped contact region and the sixth doped region to the second electrode.

14. The operating method for the semiconductor structure according to claim 9, wherein the first electrode is the anode, the second electrode is the cathode.

* * * * *